(12) United States Patent
Chiang

(10) Patent No.: US 7,749,014 B2
(45) Date of Patent: Jul. 6, 2010

(54) ELECTRICAL CONNECTOR ASSEMBLY

(75) Inventor: Chun-Hsiang Chiang, Taipei Hsien (TW)

(73) Assignee: Molex Incorporated, Lisle, IL (US)

( * ) Notice: Subject to any disclaimer, the term of this patent is extended or adjusted under 35 U.S.C. 154(b) by 132 days.

(21) Appl. No.: 12/190,899

(22) Filed: Aug. 13, 2008

(65) Prior Publication Data

US 2009/0203245 A1 Aug. 13, 2009

(30) Foreign Application Priority Data

Aug. 13, 2007 (TW) .............................. 96213324 U
Aug. 13, 2007 (TW) .............................. 96213329 U

(51) Int. Cl.
*H01R 13/62* (2006.01)
(52) U.S. Cl. .......................... 439/331; 439/73; 439/487
(58) Field of Classification Search ................. 439/331, 439/330, 70, 487, 73
See application file for complete search history.

(56) References Cited

U.S. PATENT DOCUMENTS 7,493,937 B2 * 2/2009 Chen et al. ................. 165/80.2

2005/0287858 A1 * 12/2005 Toda et al. .................. 439/331
2006/0141840 A1 * 6/2006 Ma ............................ 439/331
2007/0232113 A1 * 10/2007 Ho ............................. 439/331
2008/0160814 A1 * 7/2008 Howell ....................... 439/331

* cited by examiner

*Primary Examiner*—Hien Vu
(74) *Attorney, Agent, or Firm*—Stephen L. Sheldon

(57) ABSTRACT

An electrical connector assembly for mounting on a circuit board includes a pressing frame, a base, and a pressing pole. The base and the pressing frame may be mounted on two opposite surfaces the circuit board so that a pivoting portion and protruding pieces of the base respectively pass through the circuit board. The pressing frame is mounted on the pivoting portion. The pressing pole mounts to the protruding pieces and can be translated so as to urge the pressing frame toward a closed position. A receptacle connector may be mounted between the pivoting portion and the protruding pieces and secured by the pressing frame. A radiator may be mounted over on the receptacle connector. A plurality of fastener may extend between the radiator and the base so as to secure the radiator in position.

17 Claims, 8 Drawing Sheets

ELECTRICAL CONNECTOR ASSEMBLY

BACKGROUND OF THE INVENTION

This application claim priority to Taiwanese Application No. 96213329, filed Aug. 13, 2007, entitled Lever Holder for Back Plate and also claims priority to Taiwanese Application No. 96213324, filed Aug. 13, 2007, entitled Fixing a Socket and Heat Sink at One Back Plate.

FIELD OF THE INVENTION

The present invention relates to a connector assembly, and more particular to an connector assembly for a socket connector which a pressing frame.

DESCRIPTION OF RELATED ART

Chip modules are conventionally electrically connected with a circuit board by inserting the chip module into a socket. In the past, the chip module was a pin grid array (PGA) design that included a number of pins that were inserted into holes in the socket. While a number of technologies were used to prevent damage to the pins on the chip module, if the pins were bent then the chip might have to be scrapped. Therefore, to avoid such issues, chip module designs have begun in certain circumstances to use a land grid array (LGA) socket design. Basically, the pins are provided on the socket and the chip module includes mating pads. The chip module is aligned and securely mounted to the socket so as to ensure an electrical connection between the mating pads of the chip module and the pins of the socket. Thus, the risk of damage to the pins is shifted to the typically less expensive socket.

To secure the chip module to the socket, a fastening device is used. As can be appreciated, to ensure a reliable connection, the fastening device needs to ensure there is a secure connection between the pads on the chip module and the pins in the socket.

A conventional fastening system generally includes a base frame, a pressing frame and a pressing rod. The pressing frame is pivotally disposed on the base frame and can be opened and closed. The pressing rod is also pivotally disposed on the base frame. The pressing frame can be pivoted and fastened and fixed on the base frame based on the operation of the pressing rod. Once closed, the pressing frame is intended to press on a chip module firmly so that the chip module securely engages the pins on the socket connector. Taiwan Patent Application Nos. 92220594, 92220960, 92216478, 92216903 and the like disclose an embodiment of this fastening system.

Other suggestions have also been made regarding the coupling of a chip module in a socket connector. For example, TW utility patent NO. 572443 (application NO. 092211313) discloses a buckle for securing a socket connector, which supports a chip module (such as the flat grid array package) so that the chip module is electronically connected with the socket connector. The buckle includes a base, a pressing frame, and a pressing pole. The socket connector is set on the base. The pressing frame and the pressing pole pivot relative to the base so that the pressing pole exerts a force on the pressing frame, which in turn presses the chip module into the socket connector (and the socket connector into the circuit board). The base is set below a circuit board to provide a back board and the circuit board is sandwiched between the base and the pressing frame.

However, as the semiconductor industry has continued to develop, the tendency has been for chip modules to either generate increased thermal loads or decrease in size (or both). In order to effectively distribute the generated thermal energy (so as to allow the chip to operate at an acceptable temperature level), a heat distributing module having a larger surface area can be attached on the surface of the chip module. In operation, the heat distributing module conducts heat away from the surface of the chip module so as to reduce the temperature of the chip module, thereby improving the operation and the life-span of the chip module.

For example, TW utility patent NO. M279916 (application NO. 094211044) discloses a heat distributing structure, which includes a heat distributing module, a frame module, a host board and a back board. The frame module and the back board cooperate and are respectively fixed on an upper end-face and a lower end-face of the host board. The heat distributing module is set in the frame module. Hence, the heat of the chip module can be distributed by setting the heat distributing module on the chip module.

While existing designs provide certain benefits, further improvements in how the chip module may be secured would be appreciated.

SUMMARY OF THE INVENTION

In an embodiment, a fastening system includes a base that is used to secure a pressing frame. The base may be mounted on a printed circuit board (PCB). The base may include a pivoting portion and two protruding pieces. A receptacle connector is aligned with the base and positioned between the pivoting portion and the second side of the PCB. A pressing frame may be pivotally mounted on the pivoting portion. A pressing pole mounts to the two protruding pieces and pivots so as to engage the pressing frame and cause the pressing frame to secure a chip module in the receptacle connector. A radiator may be positioned so that it engages the chip module. Apertures in the PCB allow a fastener to extend from the radiator through the PCB so that the base may support the radiator.

BRIEF DESCRIPTION OF THE DRAWINGS

The features and technology of the present invention can be further understood by reference to the detailed description which follows taken in conjunction with the accompanying drawings, and the accompanying drawings are provided only for reference and explanation and are not intended to otherwise limit the present invention.

DETAILED DESCRIPTION OF EXEMPLARY EMBODIMENTS

Figure 1:
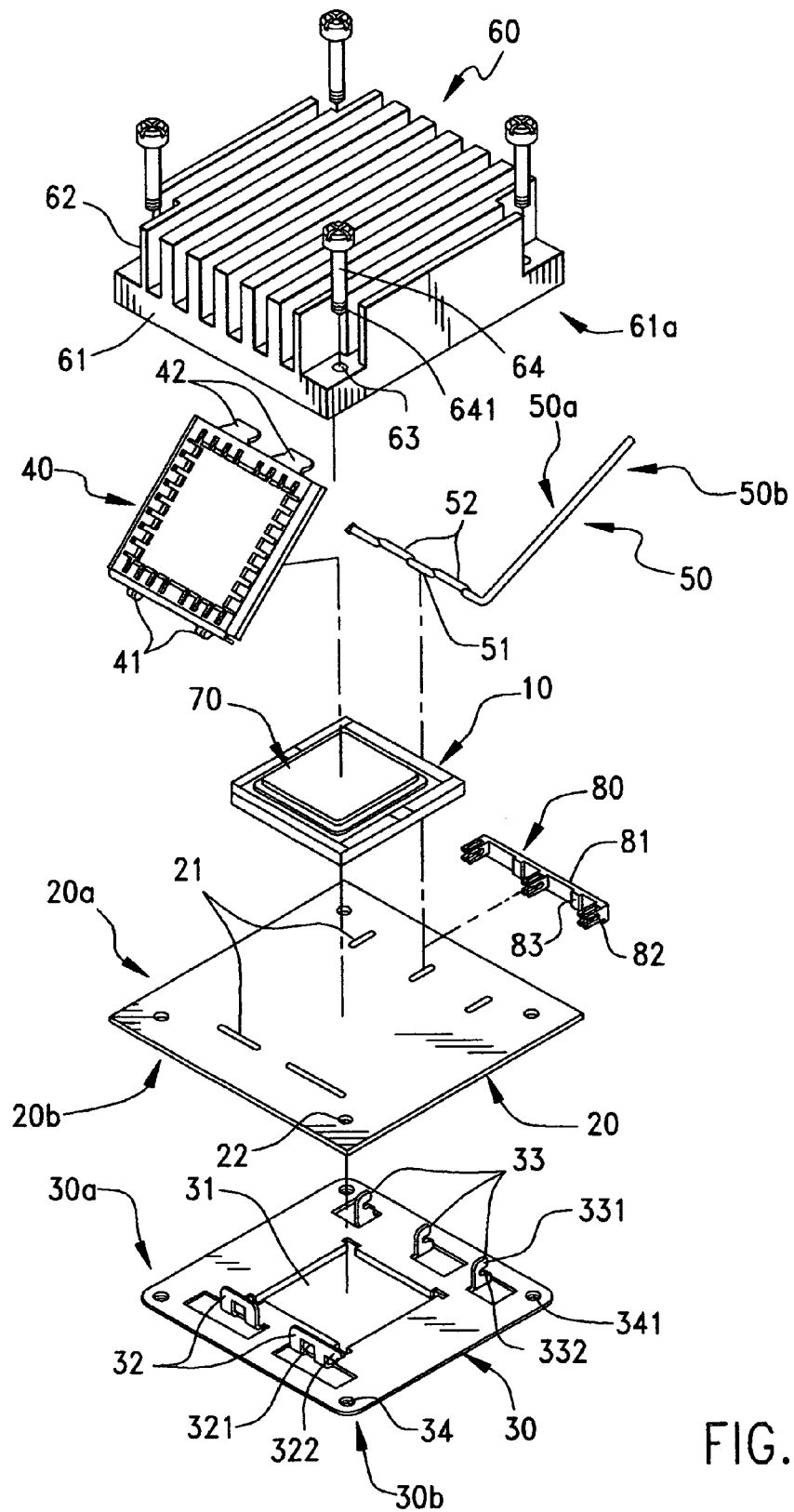
FIG. 1 is an exploded axonometric view of an exemplary embodiment of a chip module securing system.

Referring to FIG. 1, an embodiment of an electrical connector assembly that includes a receptacle connector 10, a circuit board 20, a base 30, a pressing frame 40, a pressing pole 50, and a radiator 60 is depicted.

The receptacle connector 10 electronically connects with a chip module 70. The circuit board 20 includes a plurality of penetrating holes 21 and through holes 22, and the penetrating holes 21 and the through holes 22 respectively pass through an upper end-face and a lower end-face of the circuit board 20.

The base 30 includes first surface 30a and a second surface 30b with a hollow portion 31 passing between the first and second surface thereof. Two pivoting portions 32 and at least two protruding pieces 33 are set on the first surface 30a of the base 30. The pivoting portions 32 and the protruding pieces 33 bend upwardly from the first surface 30a of the base 30. The protruding pieces 33 and pivoting portions 32 are positioned on opposite sides of the hollow portion 31. A plurality of fixing holes 34 are defined on the base 30 correspondingly to the through holes 22 of the circuit boards 20. As depicted, the side wall having fixing holes 34 is set with screw threads 341, and there are three protruding pieces 33. The protruding pieces 33 each including an opening 331. A slot 332 communicates with the opening 331, and an end of the slot 332 is semicircle-shaped. The slot 332, opening 331 and end of the slot 332 thus form a first channel. The two pivoting portions 32 define a pivoting hole 321 respectively, and a catching piece 322 protrudes from a side of one pivoting portion 32.

As depicted, the pressing frame 40 is quadrate and hollow inside. The pressing frame 40 includes two protruding portions 41 and at least one extending piece 42. The protruding portions 41 protrude from one end of the pressing frame 40. The extending pieces 42 bend and extend from the opposite ends of the two protruding portions 41. Preferably, as depicted, there are two extending pieces 42. While not required, as can be appreciated, the use of two extending pieces 42 helps ensure the force exerted on the chip module 70 is evenly applied.

The pressing pole 50 is L-shaped and includes a spin axis portion 51 and at least one pressing portion 52. As depicted, the spin axis portion 51 is offset so as to form the pressing portion 52. Preferably, there are two spin axis portions 51, and there is space between the two spin axis portions 51. While not required, the use of two spin axis portions 51 allows for a more even distribution of the forces exerted when the pressing portion 52 acts against the pressing frame 40.

The radiator 60 includes a member 61 and a plurality of cooling fins 62 that extend upwards from a top of the member 61, and a plurality of holes 63 that pass through the member 61. The plurality of holes 63 correspond to the through holes 22 of the circuit board 20 and the fixing holes 34 of the base 30. As depicted in FIG. 1, there are four holes 63, (as well as four through holes 22 and four fixing holes 34) but as can be appreciated from FIG. 5, some other number of holes may be used.

Figure 2:
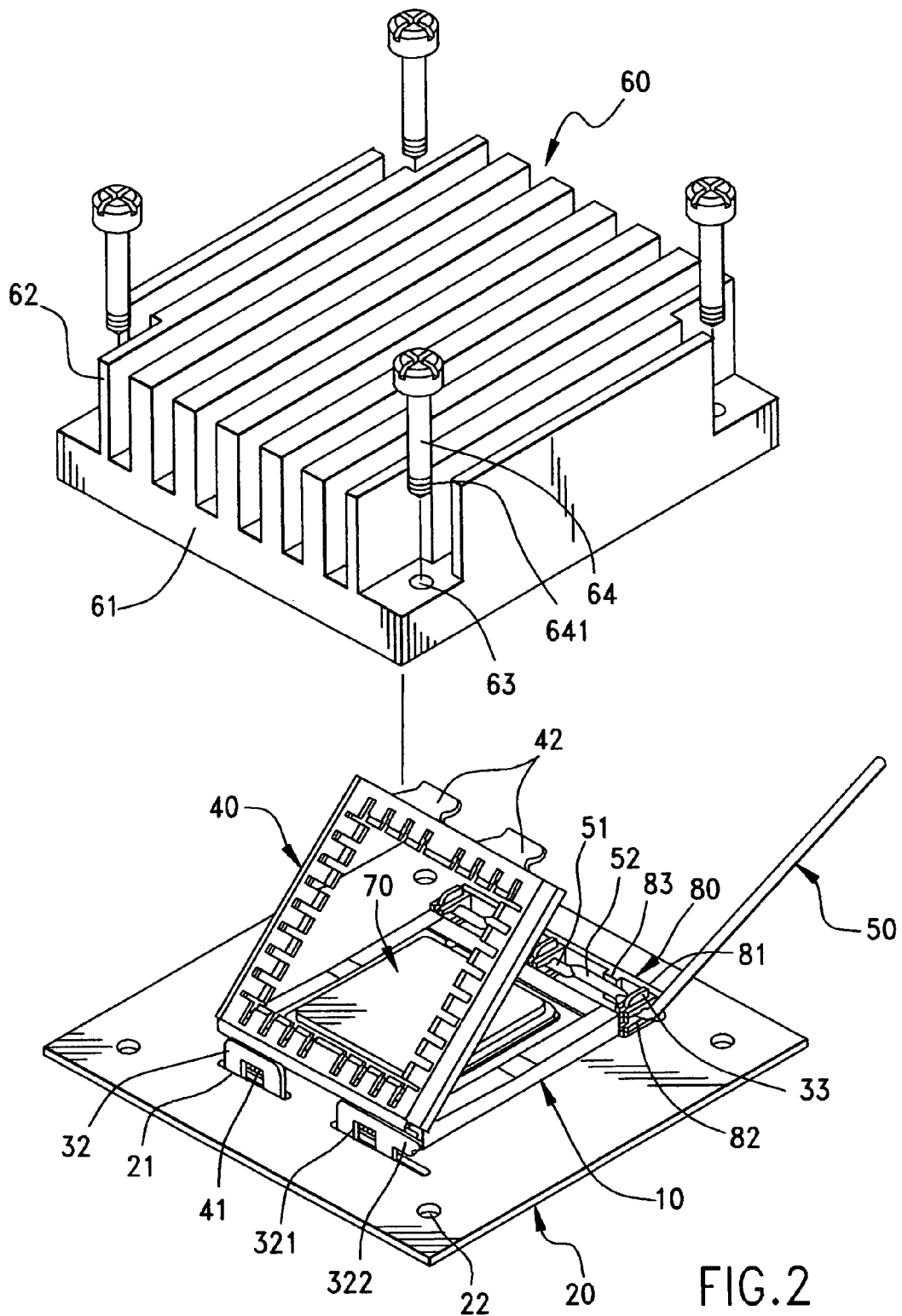
FIG. 2 is a axonometric view of an embodiment of a pressing frame that is lifted.
Figure 3:
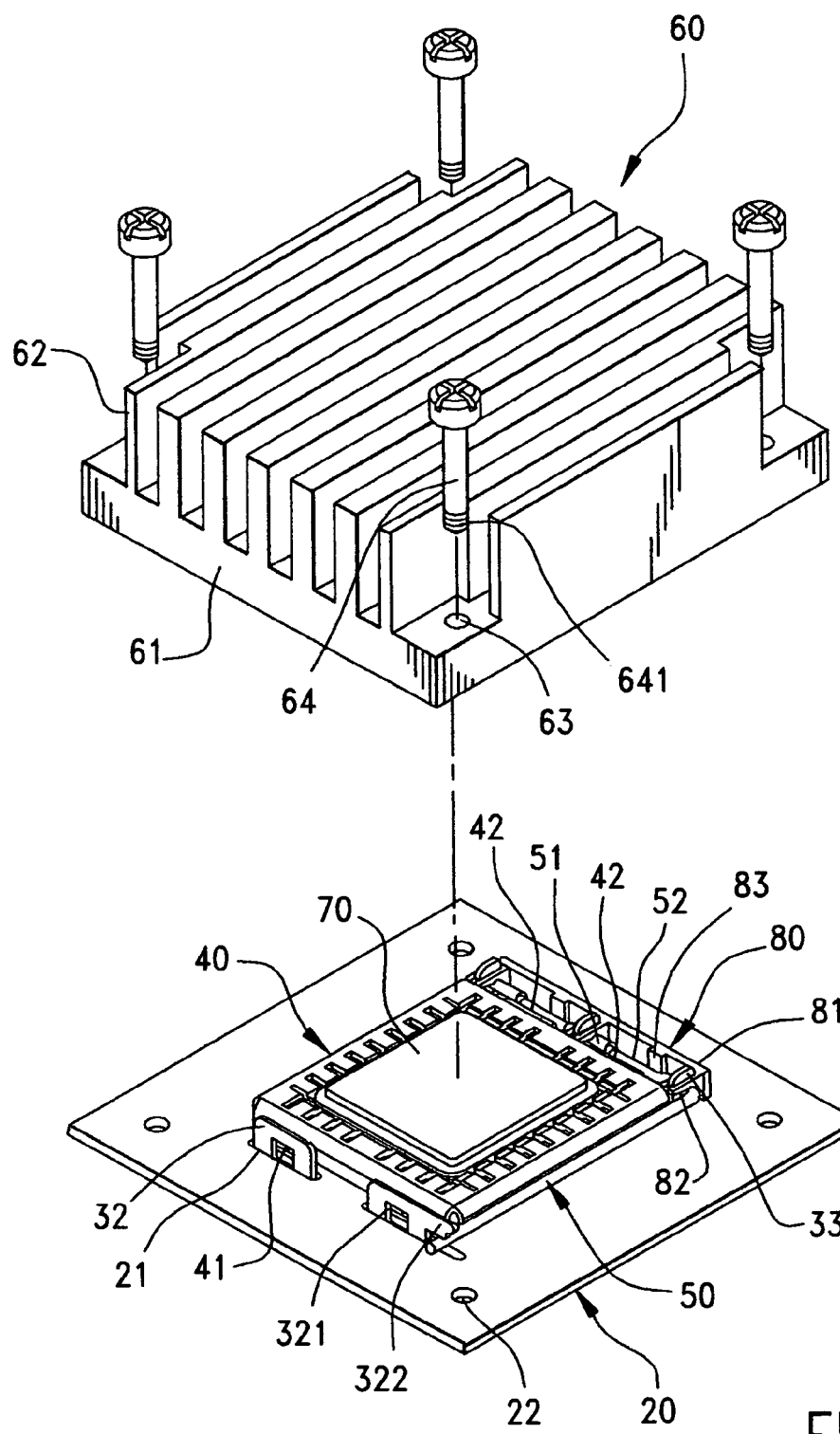
FIG. 3 is a axonometric view of an embodiment of a pressing frame that is covered.

Referring to FIGS. 1-3, the receptacle connector 10 and the base 30 are oppositely set on a top side 20a and a bottom side 20b of the circuit board 20. The pivoting portions 32 and the protruding pieces 33 are respectively pass through the penetrating holes 21 of the circuit board 20 to protrude out of the top side 20a of the circuit board 20. The receptacle connector 10 is set between the pivoting portions 32 and the protruding pieces 33. The fixing holes 34 of the base 30 are configured to correspond to the holes 22 of the circuit board 20.

The protruding portions 41 of the pressing frame 40 are respectively pivoted into pivoting holes 321 of the pivoting portions 32 of the base 30, and the pressing frame 40 can be translated relative to the base 30 and circuit board 20 from a secure position (e.g., from lowered position) to an open position (e.g., a raised position). When the pressing frame 40 is lowered, the chip module 70 can be pressed onto the receptacle connector 10.

The spin axis portion 51 of the pressing pole 50 is set in the slot 332 of the protruding pieces 33 by passing through the opening 331 to rest in a pivotal manner in the slot 332 of protruding pieces 33. The pressing pole 50 can then be rotated about the spin axis portion 51. The pressing portion 52 is configured to engage the extending piece 42 of the pressing frame 40. When the pressing pole 50 is rotated, the pressing portion 52 is pressed on the extending piece 42 of the covered pressing frame 40.

Referring to FIG. 3, when the pressing frame 40 covers the chip module 70 (e.g., is move to a securing position), the pressing pole 50 can be rotated so as to cause the pressing portion 52 of the pressing pole 50 to press on the extending piece 42 of the pressing frame 40, thereby bringing the pressing frame 40 in a covered state. The pressing pole 50 can be supported by the catching piece 322 when fully rotated (e.g., when the pressing pole is in a locked position). Therefore, by pivoting the pressing pole so that it engages the catching piece 322, the extending piece 42 of the pressing frame 40 is firmly pressed by the pressing portion 52 of the pressing pole 50, and, therefore, the chip module 70 is pressed into the socket in a secure manner. This ensures that the chip module 70 is securely connected with the receptacle connector 10. Preferably, as shown in the Figs, the two pressing portions 52 respectively press the corresponding two extending pieces 42 to firmly press the pressing frame 40. However, in an alternative embodiment, the pressing frame 40 can be lowered and pressed into position with one pressing portion 52 engaging one extending piece 42.

Figure 4:
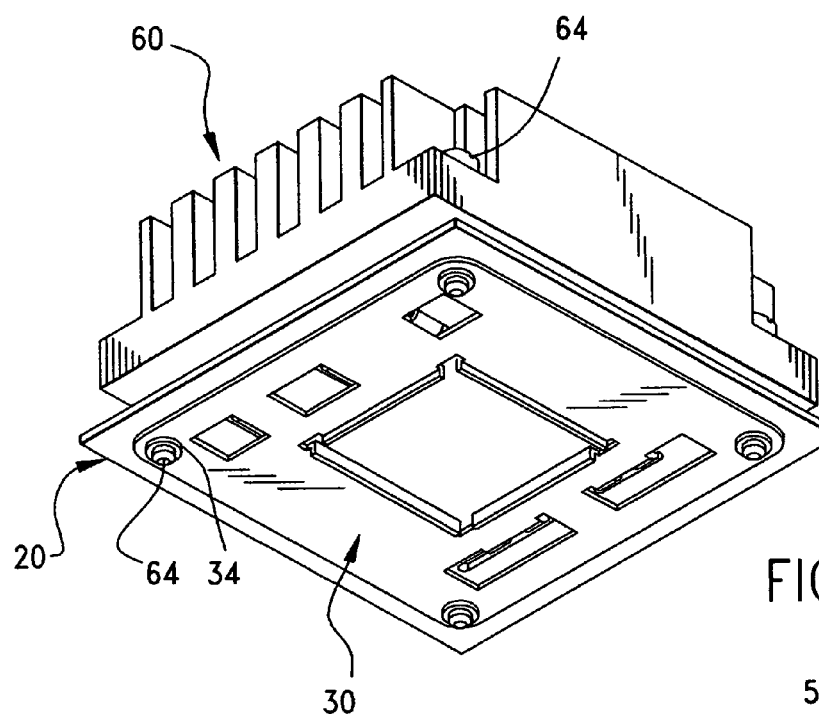
FIG. 4 is a bottom view of an embodiment of an electrical connector assembly.
Figure 9:
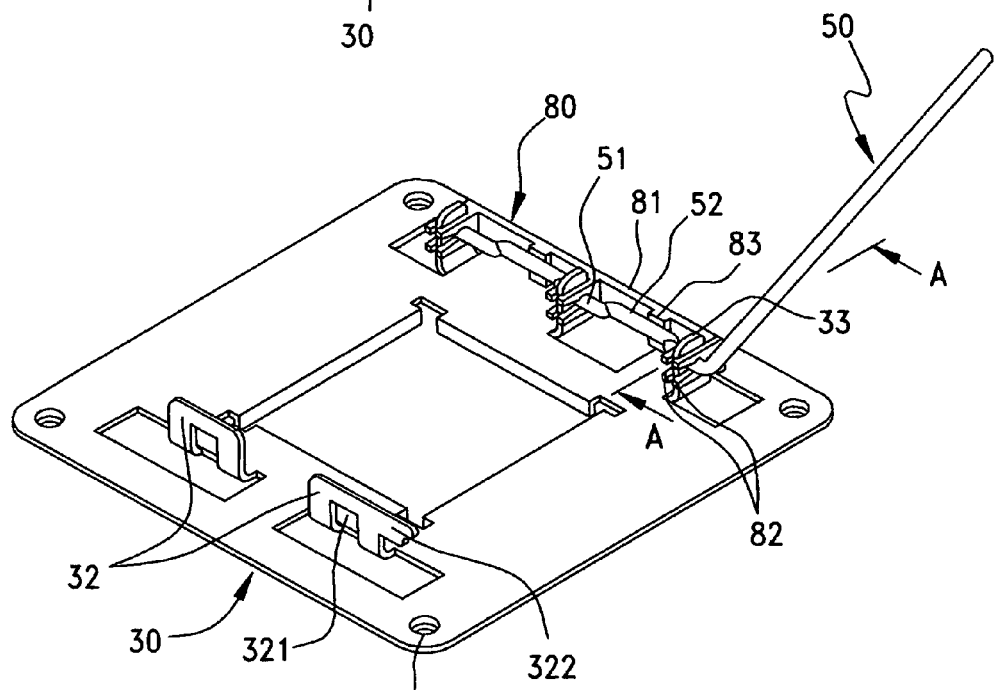
FIG. 9 is an axonometric view of an embodiment of the base, the pressing pole and the buckle piece assembled together.

Please refer to FIG. 1, FIG. 3, and FIG. 4, the radiator 60 is set above the receptacle connector 10. As noted above, the holes 63 correspond to the through holes 22 of the circuit board 20. To secure the radiator 60, a fastener (screw bolt) 64 passes through the hole 63. The fastener includes external thread 641 that is provided near an end of the fastener 64, and each fastener 64 passes through the through holes 22 of the circuit board 20 to mesh with the screw thread 341 of the fixing hole 34 of the base 30. The external thread 641 of the fastener 64 meshes with the screw thread 341 of the fixing hole 34. Hence, the radiator 60 of the present invention can be fixed on the base 30 and uses the base 30 together with the pressing frame 40.

The radiator 60 is fixed above the chip module 70 so that a bottom 61a of the member 61 of the radiator 60 is in contact with the chip module 70, and thereby helps conduct heat away from the chip module so as to cool the chip module 70. It should be noted that other embodiments are also envisioned for securing the radiator 60. For example, rather then engage screw threads 341, the fixing hole 34 could be enlarged so that the fastener 64 extends through the fixing hole 34 and is secured with a conventional fastening mechanism, such as a nut provided below the base (not shown). Thus, unless otherwise noted, the depicted embodiments are not intended to be limiting.

Figure 5:
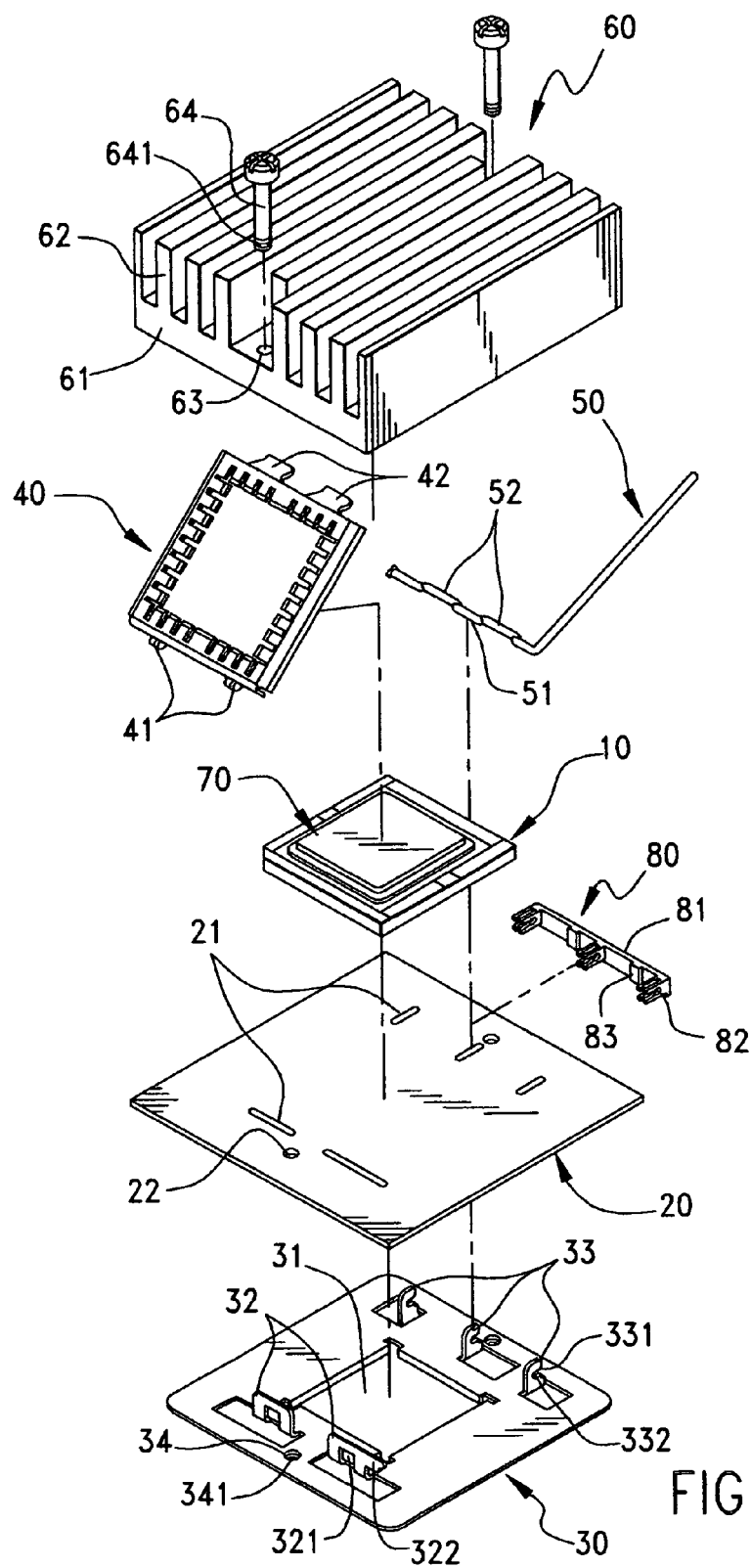
FIG. 5 is an exploded axonometric view of another embodiment of an electrical connector assembly.

Looking at FIG. 5, another embodiment is illustrated. As can be appreciated, the member 61 of the radiator 60 has two holes 63. Hence, two through holes 22 are provided in the circuit board 20 and two fixing holes 34 are provided in the base 30 so that two fasteners can extend through the holes 63, the through holes 22 and into the fixing holes 34. Thus, the securing of the radiator to the base can be accomplished with a different number of fasteners.

Figure 6:
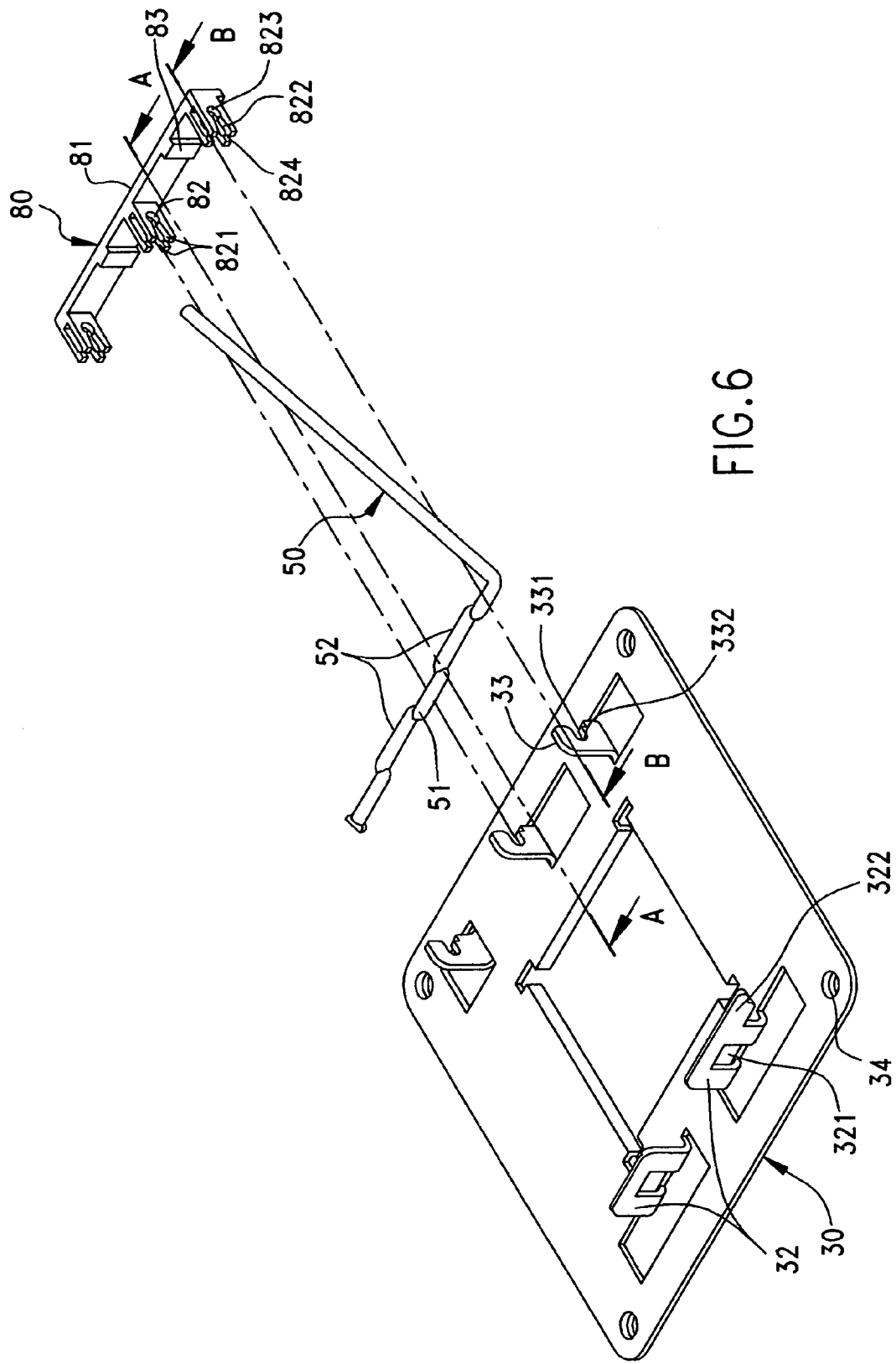
FIG. 6 is an exploded axonometric view showing an embodiment of a base, a pressing pole, and a buckle piece.
Figure 7:
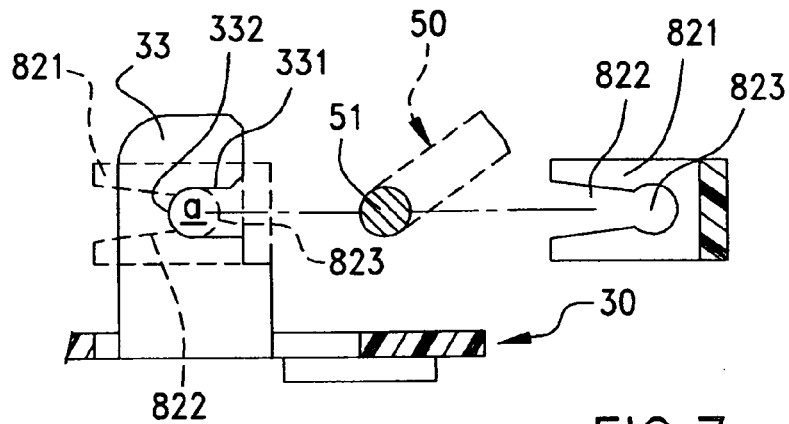
FIG. 7 is a cutaway view of the embodiment depicted in FIG. 6, taken along the line A-A of FIG. 6 showing the base and the buckle piece moving toward an assembled state.

As illustrated in FIG. 1, and shown in greater detail in FIGS. 6-10, a buckle 80 may be used to secure the pressing pole 50 to the protruding pieces 33. The buckle piece 80 includes a base board 81 and at least two clamping modules 82 that extend from the base board 81. As depicted in FIG. 6, three clamping modules 82 are used. However, some other number of clamping modules may be included if desired. As illustrated, each clamping module 82 includes two spaced clamping pieces 821. In addition, a limiting block 83 is positioned on the base board 81 so that it extends towards the pressing portion 52 of the pressing pole 50. The clamping module 82 faces the corresponding protruding pieces 33 and is configured to engage the protruding piece 33. The protruding piece 33 is configured to be positioned between the two corresponding clamping pieces 821 so that the two corresponding clamping pieces 821 cover the opening 331 of the protruding pieces 33. The slot 332 of the protruding piece 33 defines a limiting space (shown in FIG. 7) to fix the spin axis portion 51 of the pressing pole 50.

As depicted, the end of the clamping pieces 821 of each clamping module 82 defines a through jaw 822 which has an opening that extends towards the base board 81, and a notch 823 that is in communication with the through jaws 822. As illustrated, the notch 823 is C-shaped (reverse C-shaped in the Figs). Thus, the through jaw 822 and notch 823 form a second channel that is configured to be aligned with the first channel when the buckle 80 is mounted on the protruding piece 33. As depicted, the inside walls of the two clamping modules 82 respectively extend inwards to form a hook 824. The hook 824 allows the clamping module to be snapped onto the protruding member 33 and be retained in position. As can be appreciated from FIGS. 8 and 10, a protruding block 825 extends between the two clamping pieces 821.

Figure 8:
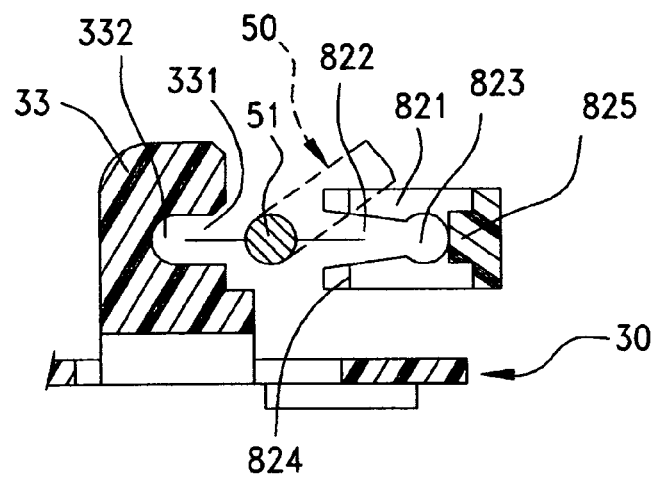
FIG. 8 is a cutaway view of the embodiment depicted in FIG. 6, is a cutaway view of B-B of FIG. 6 showing the base and the buckle piece moving toward an assembled state.
Figure 10:
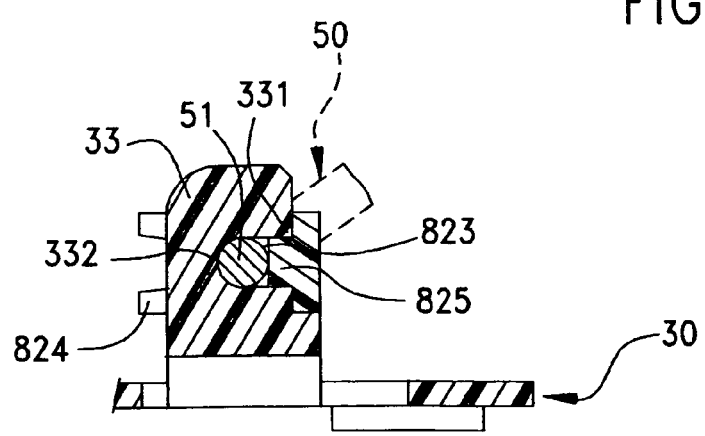
FIG. 10 is a cutaway view of the embodiment depicted in FIG. 9, taken along the line A-A of FIG. 9.

When the each clamping module 82 clamps the corresponding protruding piece 33, the spin axis portion 51 of the pressing pole 50 passes through the through jaws 822 of the each clamping piece 821, the spin axis portion 51 can be simultaneously fixed in the slot 332 of each protruding piece 33 and the notch 823 of each clamping piece 821 (e.g., secured in the first and second channel). Thus, a limiting space is formed after the each notch 823 matches up with each slot 332. As depicted, the notch 823 engages the slot 332 to receive the spin axis portion 51. In particular, the C-shaped notch 823 engages the semicircle-shaped slot 332 to receive the spin axis portion 51. The protruding block 825 extends into the open 331 of the protruding piece 33 to support the outside of the spin axis portion 51. Each clamping piece 821 clamps the inside end of the protruding piece 33 via the hook 824 to secure the buckle 80 to the protruding piece 33. When the pressing pole 50 is translated toward a closed position (e.g., rotated in a pressing direction 50b), the pressing portion 52 of the pressing pole 50 rotates so as to exert a force on the extending piece 42 of the pressing frame 40. Prior to translation in pressing direction 50b, the pressing portion 52 presses against the limiting block 83 of the buckle 80 so as to limit translation of pressing pole 50 in opening direction 50a (as shown in FIG. 1, FIG. 2 and FIG. 8).

Thus, when compared to the prior art which combines the radiator and the pressing frame via two bases, the radiator 60 and the pressing frame 40 are combined by the one base 30, and thereby simplifying the structure and reducing the manufacture cost of the present invention. Furthermore, the assembly procedure of the radiator 60, the pressing frame 40, and the base 30 is relatively straightforward. Hence, the assembly process is improved and the time spent doing the installation can be reduced.

Figure 11:
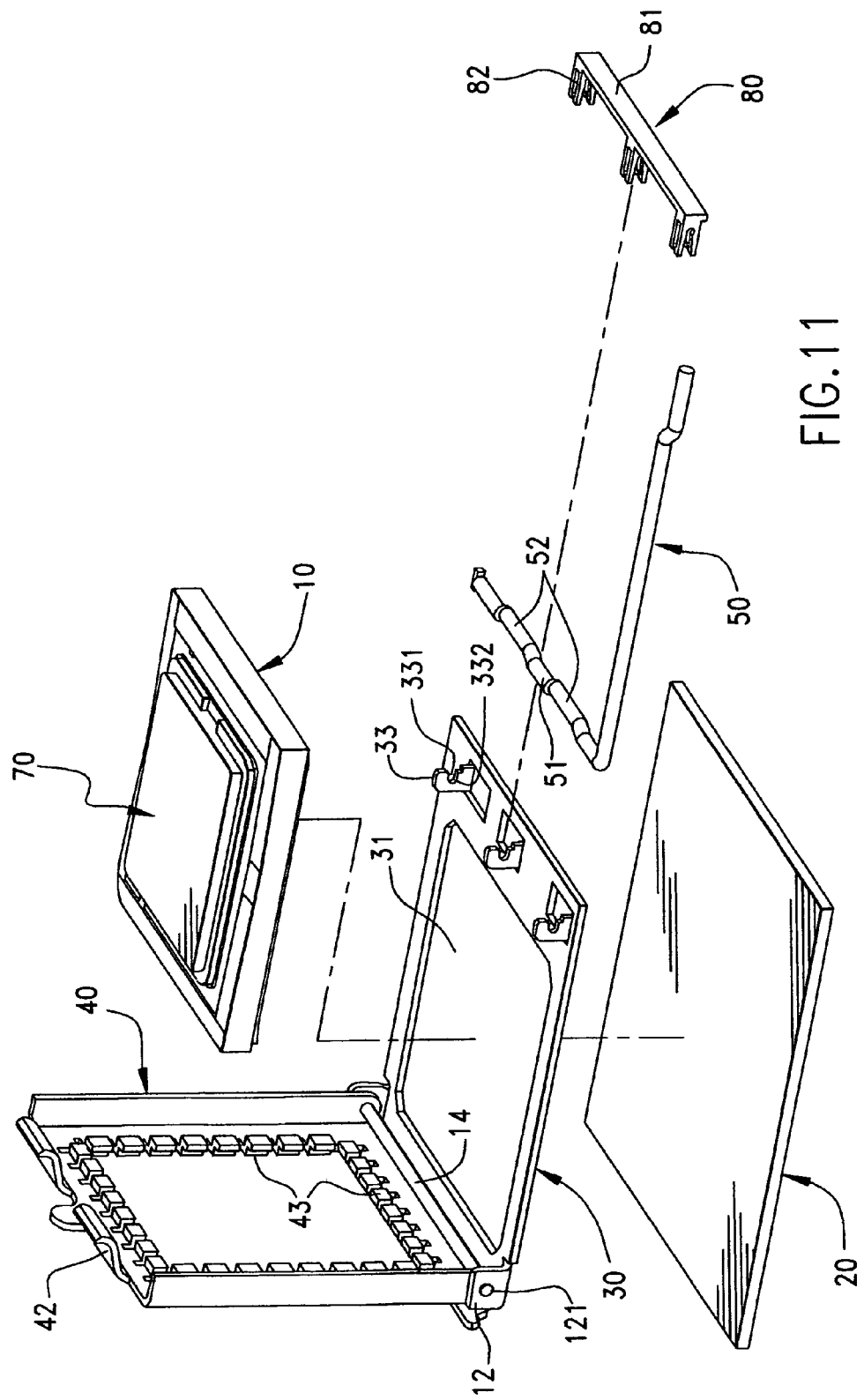
FIG. 11 is an exploded axonometric view of an alternative exemplary embodiment of a chip module securing system.

Referring to FIG. 11, another exemplary embodiment of chip holding module is illustrated. The base 30 is disposed on the circuit board 20 to form a fixing mode for a base frame. The pressing frame 40 and the base 30 are all disposed on the circuit board 20, and the socket connector 10 are electrically connected with the circuit board 20 through the hollow-out portion 31 of the base 30.

In the embodiment, the base 30 of the present invention may be designed to have various types of pivoting portions 12. The base 30 may have two pivoting portions 12 respectively bent upwards from two ends of the same side thereof, each of which has a circular pivoting hole 121. A pivoting shaft 14 passes through the pivoting holes 121 of the pivoting portions 12 and the pressing frame 40, whereby the pressing frame 40 is pivotally disposed on the pivoting portions 12 of the base 30 and may be translated between an open position and a closed position. The pivoting portions 12 of the base 30 aren't limited in their shapes and structures, as long as the pressing frame 40 can be pivotally disposed on the pivoting portions 12.

Consequently, the spin axis portion 51 of the pressing rod 50 can be pivotally disposed in the slot 332 of each protruding piece 33, so that the pressing rod 50 can be assembled on the base 30 easily. As depicted, each clamping module 82 of the fastening element 80 engages a corresponding protruding piece 33 to cover the gap 331, thereby fixing the spin axis portion 51 of the pressing rod 50 firmly in the channel formed in the protruding piece 33. Comparing with convention designs described above, the present invention can prevent the pressing rod 30 from swinging or shedding via the engagement of the protruding pieces 33 and the fastening element 80 and pivotally dispose the pressing rod 50 on the base 30 easily based on the protruding pieces 33 and the fastening element 80 thereby achieving the effect of convenient assembly.

As can be appreciated, the pressing rod 50 can be assembled on the base without any fixture, so issues associated with the use of a fixture on the assembly can be avoided and the cost can be reduced. Further, if the pressing rod 50 is damaged, a user can readily disassemble the fastening element 80 and then replace the pressing rod 50 without the need to replace the base 30.

While the invention has been described in terms of exemplary embodiments, it is to be understood that the invention needs not be limited to the embodiments disclosed. On the contrary, it is intended to cover various modifications and similar arrangements included within the spirit and scope of the appended claims which are to be accorded with the broadest interpretation so as to encompass all such modifications and similar structures.

What is claimed is:

1. An electrical connector for mounting on a circuit board, comprising:

a base configured to mount to a first side of the circuit board, the base including a pivoting portion and at least two protruding pieces and a first plurality of holes, the pivoting portion and the at least two protruding pieces configured to extend through apertures in the circuit board;

a receptacle connector configured to mount to a second side of the circuit board, the receptacle connector configured to be positioned between the pivoting portion and the protruding pieces;

a pressing frame configured to pivotally mount to the pivoting portion and to translate relative to the pivoting portion from an open position to a secure position;

a pressing pole configured to be coupled to the protruding pieces, the pressing pole configured to press the pressing frame into the secure position; and a buckle insert member configured to pivotally couple the pressing pole to the protruding pieces; and a radiator configured to mount on the receptacle connector, the radiator including a second plurality of holes correspondingly to the first plurality of holes of the base, wherein, in operation, a plurality of fasteners engage the first and second plurality of holes so as to secure the radiator to the base so that the base supports the radiator and the pressing frame.

2. The electrical connector assembly of claim 1, wherein the first plurality of holes in the base are threaded.

3. The electrical connector assembly of claim 1, wherein the pressing frame include an extending piece and the pressing pole includes a pressing portion, wherein, in operation, translation of the pressing pole causes the pressing portion to engage the extending piece so as to urge the pressing frame into a secure position.

4. The electrical connector assembly of claim 3, wherein the buckle insert member comprises a base board, and at least two clamping modules configured to couple to the at least two protruding pieces.

5. The electrical connector assembly of claim 4, wherein the at least two clamping modules both comprises two spaced clamping pieces configured so as to accept one of at least two protruding piece therebetween, and at least one of the two clamping pieces of each of the clamping modules includes a jaw configured to engage the respective protruding piece so as to secure the buckle to the base.

6. The electrical connector assembly of claim 5, wherein the pressing pole includes a spin axis portion and the buckle insert member includes a protruding block that extends between the two clamping piece modules of the each clamping module, the protruding block configured to extend into the open to secure the spin axis portion of the pressing pole.

7. The electrical connector assembly of claim 5, wherein the at least two protruding pieces include a first channel and the each of the clamping pieces of the clamping modules includes a second channel, wherein the first and second channel are configured to be aligned when the buckle insert member is mounted on the protruding pieces.

8. The electrical connector assembly of claim 4, wherein the pressing pole comprises a pressing portion and the buckle insert member includes a limiting block, wherein the limiting block is configured to engage the pressing portion so as to limit translation of the pressing pole in a first direction.

9. An electrical connector assembly, comprising:

a base with a pivoting portion and at least two protruding pieces, each of the at least two protruding pieces having a first channel formed in a side thereof;

a pressing frame pivotally supported by the pivoting portion, the pressing frame translatable between an open position and a closed position, wherein the base is configured to mount on a first side of a circuit board and the pressing frame is configured to mount a second side of a circuit board;

a pressing rod with a plurality of spin axis portions and a pressing portion, the plurality of spin axis portions pivotally disposed in the first channel of the at least two protruding pieces, the pressing frame configured to engaging the pressing frame; and a buckle insert member with a base board and at least two clamping modules extending from the base board, the at least two clamping modules coupled to the at least two protruding pieces, wherein each clamping module has two spaced clamping pieces for receiving the corresponding protruding piece therebetween, the spaced clamping pieces include a second channel, wherein the first channel and second channel are aligned and form a limiting space that securely holds the spin axis portion of the pressing rod in position.

10. The electrical connector of claim 9, wherein the base is configured to support a radiator mounted on the second side of the circuit board.

11. The electrical connector of claim 10, further comprising a radiator, the radiator configured to be mounted so that the pressing frame is between the radiator and the circuit board, wherein the base includes a first plurality of holes and the radiator include a corresponding second plurality of holes, the first and second plurality of holes configured to secure the radiator in position.

12. The electrical connector assembly of claim 9, wherein the clamping pieces include opposing jaws, the opposing jaws configured to engage the protruding piece received therebetween and secure the buckle to the base.

13. The electrical connector of claim 12, wherein the pressing pole includes three spin axis portions and the base includes three protruding portions and the buckle includes three clamping modules, the spin axis portions each separated by a pressing portion, wherein the buckle secures the three spin axis portions to the three protruding portions with the three clamping modules and the two pressing portions configured to engage the pressing frame so as to provide a distributed force for urging the pressing frame toward the closed position.

14. The electrical connector of claim 12, wherein the pressing frame includes two extending members spaced apart and an pole engaging feature, each of the two extending members configured to be engaged by one of the two pressing portions so that when the pressing pole is translated so that it engages the pole engaging feature, the pressing portion of the pressing pole presses on the extending members and holds the pressing frame in a closed position.

15. A method of mounting a chip module to a circuit board, comprising:

mounting a base to a first side of a circuit board, the base including a pivoting portion and a plurality of protruding pieces, wherein the mounting of the base comprises insert the pivoting portion and the plurality of protruding nieces through corresponding apertures in the circuit board;

mounting a chip module to a second side of the circuit board;

pivotally coupling a pressing frame to the pivoting portion;

pivotally mounting a pressing pole to the plurality of protruding pieces;

mounting a buckle insert member to the protruding pieces, the buckle insert member retaining the pressing pole;

providing a receptacle connector with the chip module thereon and in between pivoting portion and the protruding pieces;

pivoting the pressing pole to a locked position so as to securely engage the chip module with the pressing frame.

16. The method of claim 15, further comprising:

mounting a radiator on the chip module, the radiator supported by the base.

17. The method of claim 16, wherein the radiator includes a first plurality of holes and the base includes a second plurality of holes and the circuit board includes a third plurality of holes, the first and second and third plurality of holes aligned, wherein the mounting including positioning a plurality of fasteners in the first, second and third plurality of holes so that the radiator is supported by the base.

* * * * *